United States Patent [19]
Achtstaetter

[11] 3,943,385
[45] Mar. 9, 1976

[54] TIME SWITCH CIRCUIT HAVING A SWITCH-BACK TIME DELAY

[75] Inventor: Gerhard Achtstaetter, Freiburg, Germany

[73] Assignee: ITT Industries Inc., New York, N.Y.

[22] Filed: Oct. 1, 1974

[21] Appl. No.: 510,949

[30] Foreign Application Priority Data
Oct. 10, 1973 Germany............................ 2350737

[52] U.S. Cl. ............... 307/293; 307/105; 307/246; 317/9 B; 340/52 E
[51] Int. Cl.².. H03K 5/13; H02J 1/02; H02M 1/12; B60Q 1/00
[58] Field of Search ............... 307/246, 293, 10 SB; 340/52 E; 317/9 B

[56] References Cited
UNITED STATES PATENTS

| | | | |
|---|---|---|---|
| 3,757,293 | 9/1973 | Petersen | 340/52 E |
| 3,859,627 | 1/1975 | Ouantz | 307/10 SB |
| 3,860,904 | 1/1975 | Andersen | 340/52 E |
| 3,862,441 | 1/1975 | Nabetani | 307/293 |

Primary Examiner—Stanley D. Miller, Jr.
Attorney, Agent, or Firm—John T. O'Halloran; Menotti J. Lombardi, Jr.; Vincent Ingrassia

[57] ABSTRACT

This relates to a circuit for use in a car interlock and permits restarting of the motor for about three minutes after the unfastening of the safety belt. The circuit contains a difference amplifier, a first input switching the supply voltage of a capacitor charging circuit and a second input directly switching the charging circuit.

7 Claims, 4 Drawing Figures

TIME SWITCH CIRCUIT HAVING A SWITCH-BACK TIME DELAY

BACKGROUND OF THE INVENTION

The present invention relates to a monolithic integrable circuit having a delayed starting storage behavior due to a first input signal, and having a substantially longer delayed stoppage of the storage behavior due to a second input signal. The two switching time delays are effected with the aid of the constantcurrent charging and the free discharging of a parallel RC-circuit.

Such a circuit may be used, for example, as a time switch with a switch-back time delay in the order of minutes, or as a storage circuit having a storage time in the order of minutes. The problem of providing such a circuit arises, for example, in cases where a safety-belt and seat-controlled start blocking system in motor cars requires, on one hand, that the starter, independently of the safety-belt seat-controlled blocking, can be re-actuated within a period of a few minutes if the motor has previously been running for at least a short period of time, after which the ignition has been switched off and the driver's seat is no longer occupied, and, on the other hand, in cases where the starter is again to be connected to the start blocking system after the lapse of the aforementioned period of a few minutes. In this way it is possible for the driver, for example, in front of the garage, to switch off the ignition, to open the garage door, to get into the car again and to drive the car into the garage without having to fasten the seat belt.

SUMMARY OF THE INVENTION

It is an object of the present invention to provide a time-switch circuit having a switch-back time delay in the order of a few minutes.

According to a broad aspect of the invention, there is provided a circuit having a delayed starting storage behavior in response to a first input signal and having a substantially longer delayed stoppage of said storage behavior in response to a second input signal, comprising: means for receiving a supply voltage; an RC parallel circuit having one end coupled to the zero point of the circuit; a first diode; a first current mirror circuit having first and second current outputs, said first output coupled to said first diode for charging said RC-circuit; a second diode; a first transistor having a base for receiving said second input signal, an emitter coupled to the zero point of the circuit via said second diode, and a collector coupled to said first current mirror circuit for switching on and off said second current output; a source of a fixed predetermined voltage; a differential amplifier having a first input coupled to said RC-circuit and a second input coupled to said source; a second current mirror circuit coupled between the zero point of the circuit and said differential amplifier; a third current mirror circuit coupled between said means for receiving and said differential amplifier; a second transistor having a base coupled to said third current mirror circuit and to said differential amplifier, a collector coupled to the collector of said first transistor, and an emitter for serving as a first output; a third transistor having an emitter coupled to the zero point of the circuit, a collector coupled to said means for receiving, and a base for receiving said first input signal; and a fourth transistor having an emitter coupled to said means for receiving, a base coupled to the collector of said third transistor and a collector coupled to said first current mirror circuit.

The above and other objects of the present invention will be more clearly understood from the following detailed description taken in conjunction with the accompanying drawings, in which:

DESCRIPTION OF THE PREFERRED EMBODIMENTS

Figure 1:
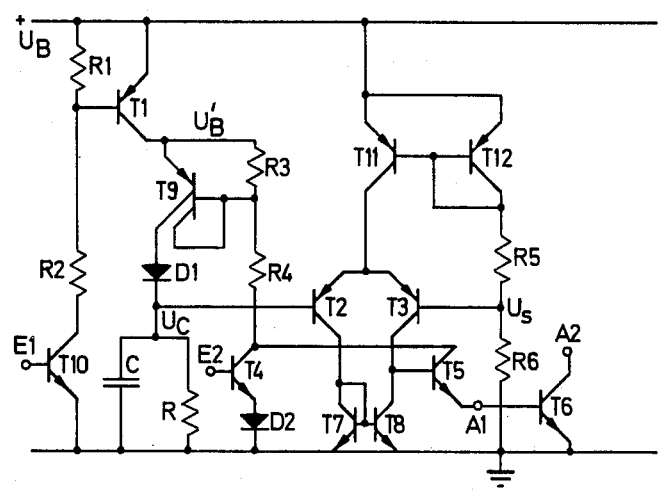
FIG. 1 is a schematic diagram of a first embodiment of the inventive circuit.

A first embodiment of the invention as shown in FIG. 1 substantially consists of the parallel RC-circuit R, C, of the differential amplifier containing the transistors T2, T3, and of the current mirror circuit enabling the charging of the capacitor C and comprising the double collector transistor T9 and the resistors R3, R4. As a current mirror circuit there is used the two-transistor circuit known from the journal "Funktechnik," 1973, pp. 313 and 314, with the aid of which it is possible to generate a second current which is either equal to or in proportion to a first current. This current mirror circuit consists of two transistors whose base-emitter paths are connected in parallel with one another while the collector of the one transistor is connected to both base electrodes directly. This has been realized, as shown in FIG. 1, by means of the double-collector transistor T9. For adjusting the two currents there is used a resistor arranged in the collector lead-in conductor of that particular transistor whose collector is connected to the base electrodes. In FIG. 1, this is the resistor R4. In addition thereto, the resistor R3 is provided for in FIG. 1, connecting the base of transistor T9 to the emitter thereof.

The collector of transistor T9 which is not connected to the base, serves to supply the parallel RC-circuit with current via the diode D1 operated in the forward direction, i.e., this collector is connected via the forward diode D1 to the junction of capacitor C and the resistor R. The second junction is coupled to the zero point of the circuit.

The terminal of resistor R4 which is not connected to the base of transistor T9, is connected to the second input signal terminal E2, via the transistor T4, i.e. the aforementioned terminal of the resistor R4 is applied to the collector of this transistor while the base thereof serves as the input, with the emitter thereof being connected to the zero point of the circuit via the diode D2 which is operated in the forward direction. Transistor T4 is of the npn-conductivity type, hence this transistor is complementary to the transistor T9 which is of the pnp-conductivity type.

The input E1 for the first input signal is applied to the base of a transistor, i.e. to the base of transistor T10 whose emitter is connected to the zero point of the circuit, and whose collector is coupled to the positive voltage-conducting pole of the source of supply voltage $U_B$ through resistors R2 and R1. The common connecting point of the two resistors R1 and R2 is coupled to the base of transistor T1 which is of the same conductivity type as the transistor T9, hence of the pnp-conductivity type, with the emitter thereof coupled to the positive voltage-conducting pole of the source of supply voltage $U_B$.

The current mirror circuit is connected at the collector of transistor T1 to the emitter of the double collector transistor T9 and the resistor R3, so that in the manner according to the invention, the current mirror circuit is acted upon by the input signal E1 with the switched supply voltage $U'_B$. Accordingly, in the current mirror circuit a current can only flow, on one hand, when the input signal E1 causes the transistor T10 to be rendered conductive and, on the other hand, when the input signal E2 causes the transistor T4 to be rendered conductive.

The differential amplifier containing the transistors T2 T3 which are likewise of the pnp-conductivity type, comprises in its common emitter circuit the current mirror circuit consisting of the further pnp-transistors T11 and T12 and of the resistors R5 and R6, so that the current mirror circuit acts as a high dynamic emitter resistance. This current mirror circuit, together with the emitters of the two transistors T11 and T12, is applied to the positive voltage-conducting pole of the source of supply voltage $U_B$.

The resistor R5 which is connected with its one terminal to the collector and the base of the transistor T12, is applied with its other terminal to the base of the differential transistor amplifier T3 and to the resistor R6, while the other terminal thereof is connected to the zero point of the circuit. Accordingly, the base of transistor T3 is applied to the fixed potential $U_s$ which may be adjusted by correspondingly selecting the resistance values of the resistors R5 and R6. As the collector resistances of the differential amplifier there is used a third current mirror circuit including the transistors T7 and T8 which are of the npn-conductivity type.

The base of transistor T5 is connected to the collector of transistor T3, hence to the collector of that particular transistor whose base is applied to the common connecting point of the resistors R5 and R6. The transistor T5 is complementary to the differential transistor amplifiers T2 and T3. The collector of transistor T5 is applied to the collector of transistor T4 while its emitter serves as the output A1. It is also possible, however, as is shown in FIG. 1, to control the base of the further npn-transistor T6 from the emitter of transistor T5, with the emitter of transistor T6 being applied to the zero point of the circuit and with the collector thereof serving as the output A2. To this output there may be connected, for example, the control winding of a relay whose other terminal is applied to the positive voltage-conducting pole of the source of supply voltage $U_B$.

The mode of operation of the embodiment shown in FIG. 1 will now be explained in greater detail with reference to the pulse diagrams shown in FIG. 2. It is assumed that the first input signal E1 which is applied to the base of transistor T10, actually exists and causes this transistor to be rendered conductive. This causes the transistor T1 to be rendered conductive and, consequently, provides the supply voltage $U'_B$ for the current mirror circuit. This is shown in FIG. 2a. In a practical application of the circuit according to the invention in a safety belt seat-controlled start-blocking system of a motorcar, it is possible to use as the input signal E1, the signal for the occupied driver's seat or the turned on ignition, with both of these signals also being capable of being applied via an OR-configuration. This would require a further transistor to be connected in parallel with the collecor-emitter path of transistor T10, to the base of which there will then be applied the other one of these input signals.

The input signal shown in FIG. 2b will appear at the second input E2 in the time position $t_o$, causing the transistor T4 to be rendered conductive, so that the series-connected resistors R3 and R4 will be connected to the zero point of the circuit via the diode D2, thus causing a current to flow in the current mirror circuit. This initiates the charging of the capacitor C, as may be taken from the showing of FIG. 2c. In the aforementioned practical application of the invention for serving as a start blocking system in a motorcar, there is used as a second input signal a signal providing information concerning the running motor. For example, an electrical signal may be derived from the oil pressure switch.

If now, as shown in FIG. 2b, the second input signal is switched off before the capacitor voltage $U_C$ has reached the threshold voltage value $U_s$ as adjusted with the aid of the voltage divider R5 and R6, the capacitor C is discharged across the resistor R in accordance with the known exponential function.

Supposing now that the second input signal is reapplied at the time position $t'_o$, and for the time until the capacitor voltage $U_C$ reaches the threshold voltage $U_s$. At this moment the differential amplifier reaches its operating range, so that the hitherto blocked transistor T5 and, consequently, also its subsequently arranged transistor T6 become conductive. The input signal E2 may now be switched off at any desired time position without causing the capacitor to be discharged again. In fact, charging of the capacitor C is continued until reaching the maximum possible capacitor voltage $U_{C-max}$.

Figure 2:
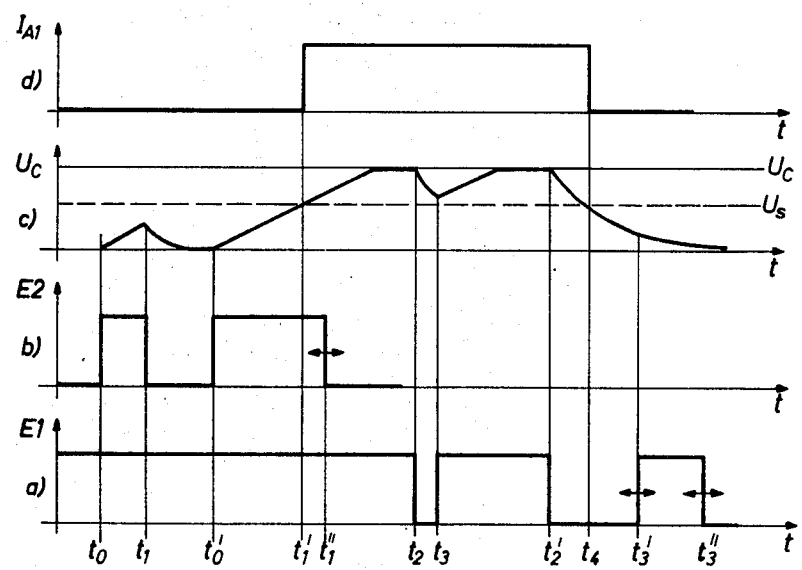
FIG. 2 shows pulse diagrams for explaining the mode of operation of the example of embodiment according to FIG. 1.

In FIG. 2, the time position of exceeding the threshold voltage $U_s$ is indicated by $t'_1$ while the time position of switching off the second input signal is indicated by $t''_1$. The free selection of disconnecting the input signal E2 is indicated in FIG. 2b by the double arrow.

When the transistor T5 is rendered conductive upon exceeding the threshold voltage $U_s$ the emitter current $I_{A1}$ rises suddenly as shown in FIG. 2D.

The described state is maintained until the first input signal E1 is switched off. Here again two cases are possible. In the first case it is assumed that the first input signal is switched off at the time position $t_2$, thus initiating the free discharge of capacitor C across resistor R. It is assumed, however, that at a time position $t_3$, the first input signal is switched on again, at which time the capacitor voltage $U_C$ has not yet again reached the threshold voltage $U_s$. In this case, charging of the capacitor is restarted because the differential amplifier again causes the transistor T5 to be rendered conductive. Within the active range of a differential amplifier the output voltages move between their final values, i.e. this is the zone in which the current changes from one side of the differential amplifier to the other. Referred to the inputs, the active range in the invention has a width of about 50 mV.

With respect to the second possible case it is assumed that the first input signal is switched off at the time position $t_2'$, by which there is again initiated the free discharge of the capacitor C. The discharge continues until time position $t_3'$ at which time the capacitor voltage $U_C$ is below the value of the threshold voltage $U_s$. On account of this, and at the time position $t_4$ the current of the differential amplifier is switched over to the other side causing the transisor T5 to be rendered non-conductive so that in FIG. 2d the emitter current of transistor T5 will again drop back to zero.

The input signal E1, after having fallen below the switching threshold, has no influence any more, so that after $t_4$ the time positions $t_3$ for the repeated switching on, and $t_3''$ for the following switching off are again variable which is indicated by the double arrows.

Accordingly, the circuit of FIG. 1 has a turn-on time delay $t_1' - t_o''$ which is required to lapse before the storage behavior starts, and a turn-off time delay $t_4 - t_2'$ which is required to lapse before the storage behavior ceases. It is to be emphasized that the turn-on and turn-off processes shown as a function of time in FIG. 2 are not exactly to scale, in particular the charging is effected very rapidly so that the turn-on time delay $t_1' - t_o'$ is substantially shorter than the turn-off time delay $t_4 - t_2'$. In a practical embodiment of the circuit serving the aforementioned start blocking of a motorcar, the turn-on time delay amounted to several seconds, and the turn-off time delay lasted a few minutes.

Figure 3:
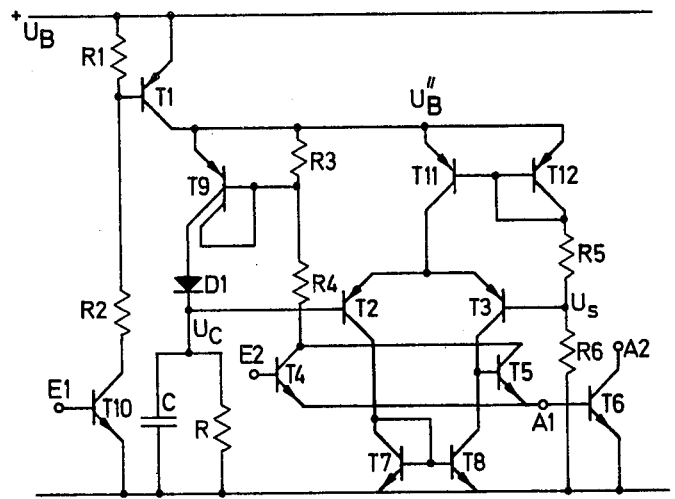
FIG. 3 is a schematic diagram of a second embodiment of the inventive circuit.

FIG. 3 shows a second embodiment of the invention having a storage behavior. This circuit differs from the embodiment shown in FIG. 1, in that now the current mirror circuit as arranged in the emitter circuit of the differential amplifier and including the transistors T11 and T12, is connectted to a supply voltage provided by the first input signal, namely to the supply voltage $U_B''$, and that the emitter of transistor T4 which is associated with the second input E2 is no longer connected to the zero point of the circuit via the second forward diode D2, but is directly connected to the emitter of transistor T5.

Although the foregoing has no effect upon the storage behavior of the circuit compared to that of the arrangement shown in FIG. 1, the curve of the output signal has a different shape as a function of time because the output signal, hence the current $I_{A1}$ as shown in FIG. 4b, from the time position of applying the second input signal, i.e. from $t_o$ or $t_o'$ to the time position of exceeding the threshold voltage $U_s$, will follow the input signal E2 and, above the threshold voltage, will follow the input signal E1, whereas in the case of the embodiment according to FIG. 1, the output signal only exists above the threshold voltage.

Figure 4:
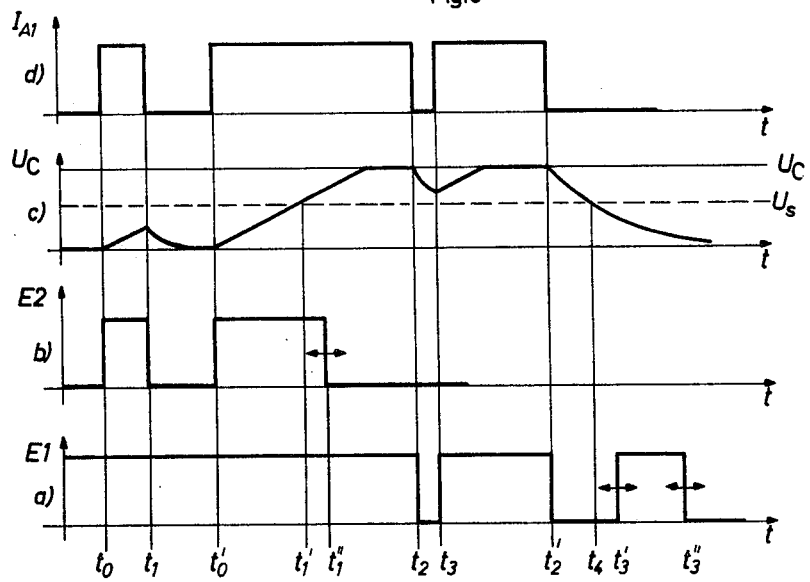
FIG. 4 shows pulse diagrams for explaining the mode of operation of the example of embodiment according to FIG. 3.

In particular, it may be seen in FIG. 4 that when an input signal E1 is applied and, thereafter, when the input signal E2 is applied at the time position $t_o$, there will again start the current-constant charging of the capacitor C, but that at the same time there also exists the output current $I_{A1}$ which, at this particular time position, consists of the emitter current of transistor T4. Turning on the second input signal at time position $t_1$ prior to reaching the switching threshold will effect, with respect to the storage behavior, the same result as in FIG. 1 but, with respect to the output signal, the output current will again become zero.

Any new turning on of the second input signal at the time position $t_o'$ will again result in the appearance of the output current $I_{A1}$. If now the charging of the capacitor is continued until the capacitor voltage $U_C$ exceeds the threshold voltage $U_s$ at the time position $t_1'$, then the second input signal may be turned off later at any arbitrary time position $t_1''$ without causing the output signal to disappear, because upon turning off the second input signal after the time poisition $t_1'$, the emitter current of transistor T5 will take over the function of the output signal $I_{A1}$, and via the collector thereof also the current mirror circuit including the transistor T9 will remain on.

If now, at the time position $t_2$, the first input signal and, consequently, also the supply voltage $U_B''$ for the current mirror circuit and the differential amplifier is turned off, the free discharge of the capacitor C is initiated across the resistor R. If, prior to reaching the threshold voltage $U_s$, the first input signal is again turned on at the time position $t_3$, the output signal will re-appear and the constant-current charging of the capacitor C is re-started.

If the first input signal is turned off again at the time position $t_2'$, and if this turning off continues beyond the time position $t_4$ of reaching the threshold voltage $U_s$, the output signal will again be turned off at the time position $t_2'$, but a new turning on at the time position $t_3'$, however, can no longer cause an output signal because both the differential amplifier and the transistor T4 are blocked.

The second embodiment of the circuit according to the invention has a somewhat simpler behavior than the embodiment according to FIG. 1, but is actually well adapted to the given conditions in a motorcar. Under the aforementioned presumption that the first input signal contains the information concerning the occupied driver's seat or the turned-on ignition, or both, and that the second input signal contains the information concerning the running motor, while the output signal serves the on-off switching of the starter, the the starter can only be actuated after the ignition has been turned on, so that the reverse order of switching sequence is not possible.

The circuit according to the invention offers the advantage of being completely insensitive to disturbing or interfering voltages superimposed upon the supply voltage $U_B$, i.e. that it, in particular, cannot be switched on or off by such interferences. By selecting the way in which the inputs are connected in accordance with the invention, and in particular by the fact that, on one hand, the second input signal is used to switch on the current mirror circuit permitting the circuit according to the invention to operate and, on the other hand, by the fact that the first input signal switches on the supply voltage for the current mirror circuit and, in the second example of embodiment, also that of the differential amplifier, positive as well as negative disturbing or interfering voltage peaks (noise crashes) superimposed upon the supply voltage $U_B$, are prevented from causing the circuit according to the invention to operate.

An added advantage of the circuit according to the invention resides in the fact that upon exceeding the threshold voltage $U_s$, hence upon reaching the storage behavior level, the supply voltage may even intermit or fail temporarily, with the time duration of this supply voltage interruption only needing to be smaller than the above mentioned turn-off time delay $t_4 - t_2'$.

While the principles of the invention have been described above in connection with specific apparatus, it is to be clearly understood that this description is made only by way of example and not as a limitation on the scope of the invention.

What is claimed is:

1. A circuit having a delayed starting storage behavior in response to a first input signal and having a substantially longer delayed stoppage of said storage behavior in response to a second input signal, comprising:
   means for receiving a supply voltage;

an RC parallel circuit having one end coupled to the zero point of the circuit;

a first diode;

a first current mirror circuit having first and second current outputs, said first output coupled to said first diode for charging said RC-circuit;

a second diode;

a first transistor having a base for receiving said second input signal, an emitter coupled to the zero point of the circuit via said second diode, and a collector coupled to said first current mirror circuit for switching on and off said second current output;

a source of a fixed predetermined voltage;

a differential amplifier having a first input coupled to said RC-circuit and a second input coupled to said source;

a second current mirror circuit coupled between the zero point of the circuit and said differential amplifier;

a third current mirror circuit coupled between said means for receiving and said differential amplifier;

a second transistor having a base coupled to said second current mirror circuit and to said differential amplifier, a collector coupled to the collector of said first transistor, and an emitter for serving as a first output;

a third transistor having an emitter coupled to the zero point of the circuit, a collector coupled to said means for receiving, and a base for receiving said first input signal; and a fourth transistor having an emitter coupled to said means for receiving, a base coupled to the collector of said third transistor and a collector coupled to said first current mirror circuit.

2. A circuit according to claim 1 further including a fifth transistor having a base coupled to the emitter of said second transistor, an emitter coupled to the zero point of the circuit, and a collector for serving as a second output.

3. A circuit according to claim 2 wherein said first current mirror circuit comprises:

first and second series connected resistors coupled between the collector of said fourth transistor and the collector of said first transistor; and a dual collector transistor having an emitter coupled to the collector of said fourth transistor, a first collector coupled to said first diode, a base coupled to a junction between said first and second resistors and a second collector coupled to said base.

4. A circuit according to claim 3 wherein said second current mirror circuit comprises sixth and seventh transistors each having a base, collector and emitter, the base of said sixth transistor coupled to the base of said seventh transistor and to the collector of said sixth transistor, and the emitters of said sixth and seventh transistors coupled to the zero point of the circuit.

5. A circuit according to claim 4 wherein said differential amplifier comprises eighth and ninth transistors, each having a base, emitter and collector, the emitter of said eighth transistor coupled to the emitter of said ninth transistor, the base of said eighth transistor connected between said RC-circuit and said first diode, the base of said ninth transistor coupled to said source, the collector of said eighth transistor coupled to the collector of said sixth transistor, and the collector of said ninth transistor coupled to the collector of said seventh transistor and the base of said second transistor.

6. A circuit according to claim 5 wherein said third current mirror circuit comprises:

tenth and eleventh transistors each having a base, emitter and collector, the emitter of said tenth transistor coupled to the emitter of said eleventh transistor and to said means for receiving, the base of said tenth transistor coupled to the base and collector of said eleventh transistor, the collector of said tenth transistor coupled to the emitters of said eight and ninth transistors, and the collector of said eleventh transistor coupled to said source.

7. A circuit having a delayed starting storage behavior in response to a first input signal and having a substantially longer delayed stoppage of said storage behavior in response to a second input signal, comprising:

means for receiving a supply voltage;

an RC parallel circuit having one end coupled to the zero point of the circuit;

a first diode;

a first current mirror circuit having first and second current outputs, said first output coupled to said first diode for charging said RC-circuit;

a first transistor having a base for receiving said second input signal, and a collector coupled to said first current mirror circuit for switching on and off said second current output;

a source of a fixed predetermined voltage;

a differential amplifier having a first input coupled to said RC circuit and a second input coupled to said source;

a second current mirror circuit coupled between the zero point of the circuit and said differential amplifier;

a third current mirror circuit coupled between said means for receiving and said differential amplifier;

a second transistor having a base coupled to said second current mirror circuit and to said differential amplifier, a collector coupled to the collector of said first transistor, and an emitter for serving as a first output and coupled to the emitter of said first transistor;

a third transistor having an emitter coupled to the zero point of the circuit, a collector coupled to said means for receiving and a base for receiving said first input signal; and a fourth transistor having an emitter coupled to said source of supply voltage, a base coupled to the collector of said third transistor and a collector coupled to said first current mirror circuit.

* * * * *